United States Patent
Otaka et al.

(10) Patent No.: US 7,065,334 B1
(45) Date of Patent: Jun. 20, 2006

(54) VARIABLE GAIN AMPLIFIER DEVICE

(75) Inventors: Shoji Otaka, Yokohama (JP); Takafumi Yamaji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/352,371

(22) Filed: Feb. 13, 2006

Related U.S. Application Data

(62) Division of application No. 09/950,630, filed on Sep. 13, 2001.

(30) Foreign Application Priority Data

Sep. 28, 2000 (JP) ............................. 2000-297453

(51) Int. Cl.
*H04B 7/00* (2006.01)
*H03F 3/45* (2006.01)

(52) U.S. Cl. ............................... 455/232.1; 455/241.1; 330/252

(58) Field of Classification Search ............. 455/232.1, 455/234.1, 236.6, 239.1, 240.1, 241.1, 251.1, 455/253.2; 330/252–254, 257, 261, 278–279, 330/288
See application file for complete search history.

(56) References Cited

U.S. PATENT DOCUMENTS

| | | | | |
|---|---|---|---|---|
| 4,201,947 A | | 5/1980 | Schade, Jr. ................. | 330/253 |
| 5,420,536 A | | 5/1995 | Faulkner et al. ............ | 330/149 |
| 5,805,987 A | * | 9/1998 | Kamase ....................... | 455/326 |
| 5,838,807 A | | 11/1998 | Andersson et al. ......... | 381/321 |
| 5,867,777 A | | 2/1999 | Yamaji et al. | |
| 5,999,053 A | | 12/1999 | Eschauzier ................. | 330/254 |
| 6,148,181 A | | 11/2000 | Otaka ......................... | 455/86 |
| 6,157,259 A | | 12/2000 | Dasgupta .................... | 330/296 |
| 6,215,989 B1 | * | 4/2001 | Otaka ........................ | 455/234.1 |
| 6,323,719 B1 | | 11/2001 | Chang et al. ................ | 327/478 |
| 6,414,552 B1 | | 7/2002 | Kronmueller et al. ....... | 330/288 |
| 6,417,701 B1 | | 7/2002 | Bolda .......................... | 327/79 |
| 6,437,643 B1 | | 8/2002 | Ueno et al. .................... | 330/85 |
| 6,563,383 B1 | | 5/2003 | Otaka et al. ................ | 330/254 |
| 6,774,685 B1 | | 8/2004 | O'Toole et al. ............. | 327/156 |
| 6,777,999 B1 | | 8/2004 | Kanou et al. ................ | 327/346 |
| 6,819,183 B1 | | 11/2004 | Zhou et al. .................. | 330/289 |
| 6,844,782 B1 | | 1/2005 | Otaka ......................... | 330/254 |
| 2002/0055341 A1 | | 5/2002 | Otaka et al. ............. | 455/200.1 |
| 2005/0220217 A1 | * | 10/2005 | Yamawaki et al. ......... | 375/297 |

FOREIGN PATENT DOCUMENTS

EP      0 797 311      9/1997

(Continued)

OTHER PUBLICATIONS

N. Abouchi, et al., Electronics, Circuits and Systems, Proceedings of ICECS, XP-010361462, pp. 189-192, "Exponential and Logarithmic Functions Using Standard CMOS 0.8 μm Technology", Sep. 5, 1999.

(Continued)

*Primary Examiner*—Ovidio Escalante
(74) *Attorney, Agent, or Firm*—Oblon, Spivak, McClelland, Maier & Neustadt, P.C.

(57) ABSTRACT

A variable gain amplifier device controlled by a first gain control signal comprises a gain controlled amplifier having a gain and including a differential pair of first and second MOS type transistors configured to operate in a weak inversion region; and a control signal converter configured to convert the first gain control signal into a second gain control signal, and supply the second gain control signal to the gain controlled amplifier to exponentially vary the gain with respect to the first gain control signal.

1 Claim, 4 Drawing Sheets

FOREIGN PATENT DOCUMENTS

| | | |
|---|---|---|
| JP | 59-127411 | 7/1984 |
| JP | 4-365209 | 12/1992 |
| JP | 7-94981 | 4/1995 |
| JP | 10-224169 | 8/1998 |
| JP | 10-276053 | 10/1998 |
| JP | 10-303658 | 11/1998 |
| JP | 2000-78036 | 3/2000 |
| JP | 2000-124962 | 4/2000 |
| JP | 2000-196386 | 7/2000 |

OTHER PUBLICATIONS

Vittoz, et al., CMOS Analog Integrated Circuit Based on Weak Inversion Operations, Jun. 1977, Solid State Circuits, IEEE Journal of, vol. 12, Issue: 3, ISSN: 0018-9200, pp. 224-231.

Salazar, et al., Micro Power CMOS Analog Cells, Oct. 1998, Integrated Circuit Design, 1998. Proceedings, Inspec Accession No.: 6147344, pp. 187-190.

Uroshanit, et al., Efficient Low—power Designs using MOSFETs in the Inversion Region, Nov. 1998, Circuits and Systems, 1998 IEEE APCCAS 1998, IEEE Asai-Pacific Conference on, Inspec Accession No.: 6282235, pp. 45-48.

Sansen, Willy M. C., "An Integrated Wide-Band Vanable-Gain Amplifier with Maximum Dynamic Range", IEEE Journal of Solid-State Circuits, vol. Sc-9, No. 4, Aug. 1974, pp. 159-166.

* cited by examiner

VARIABLE GAIN AMPLIFIER DEVICE

CROSS-REFERENCE TO RELATED APPLICATIONS

This application is a divisional of U.S. application Ser. No. 09/950,630, filed Sep. 13, 2001, and is based upon and claims the benefit of priority from the prior Japanese Patent Application No. 2000-297453, filed Sep. 28, 2000, the entire contents of each of which are incorporated herein by reference.

BACKGROUND OF THE INVENTION

1. Field of the Invention

The present invention relates to a variable gain amplifier device configured to vary a gain exponentially with respect to a gain control signal, applicable to a wireless communication apparatus such as a portable wireless device.

2. Description of the Related Art

Portable wireless devices such as a portable telephone are required to be reduced in size and weight so that they can be carried by a man, or mounted on a car or the like for use. Therefore, parts constitute the devices have been strongly desired to be monolithic ICs (integrated circuit) suitable to reductions in size and weight as compared with the hybrid construction by connecting a plurality of discrete elements. Monolithic ICs also contribute to a cost reduction of the devices.

As one of the configuration methods of a wireless transmission/receiving circuit in a wireless communication apparatus such as a portable wireless device, the direct conversion system is known. According to the direct conversion system, on the transmission circuit side, two transmission baseband signals in the quadrature relation are amplified respectively by a variable gain amplifier. The amplified quadrature transmission baseband signal is input to a quadrature modulator and converted directly into a radio-frequency (RF) signal. The RF signal is amplified by a power amplifier and transmitted by an antenna. On the reception circuit side, a reception RF signal supplied from the antenna is amplified by a low noise amplifier, and then converted directly into two reception baseband signals in the quadrature relation by a quadrature demodulator (down converter). The reception baseband signal is demodulated by a baseband signal processor.

In the field of portable telephones, recently, a CDMA (Code Division Multiple Access) system capable of high speed and high capacity communication is noted. The CDMA system performs a communication by multiplexing transmission/receiving data of a plurality of users by spreading respectively with different codes on a carrier of an identical frequency. The CDMA system cannot perform correct communication if there is a large dispersion in the power of the transmission data from a plurality of users carried by a carrier of the identical frequency received by a base station. Consequently, in a portable terminal, it is essential to perform a wide transmission power control range such as, for example, 70 dB or more, according to the distance from the terminal to the base station.

In a wireless communication apparatus using the direct conversion system, it is necessary to provide the baseband section with a variable gain amplifier in order to realize such a wide range of transmission power control. This is because it is difficult to realize the wide transmission power control range only by the RF section since the variable gain range in the RF section is limited by the isolation between input and output.

U.S. Pat. No. 6,215,989 discloses an example of a variable gain amplifier capable of a wide range gain control. According to the variable amplifier, a first gain control signal Vc is converted into a second gain control signal Vy by a control signal converter. The control signal Vy is input to a base terminal of bipolar transistors Q1, Q2 forming a differential pair in a current dividing type gain controlled amplifier. The transfer function of the gain controlled amplifier can be expressed by the Equation (1):

$$\text{Iout}/\text{Iin} = 1/[1+\exp(Vy/V_T)] \qquad (1)$$

Here, Iin and Iout are input signal current and output signal current of the gain controlled amplifier, respectively, and $V_T$ is thermal voltage, which is about 26 mV at normal temperature.

On the other hand, the transfer function of the control signal converter is expressed by the Equation (2):

$$Vy = V_T \ln\{\exp(b \cdot Vc/V_T) - 1\} \qquad (2)$$

where, b>=0, Vc>=0. In the case Vc=0, from the Equation (2), Vy becomes $-\infty$, which is interpreted that the input signal current Iin flows only in one transistor Q1 of the differential pair.

From the Equations (1), (2), a total gain of the variable gain amplifier including the control signal converter can be expressed by the Equation (3):

$$\begin{aligned}
\text{Iout}/\text{Iin} &= 1/[1 + \exp(Vy/V_T)] \qquad (3)\\
&= 1/[1 + \exp[V_T/V_T \cdot n\{\exp(b \cdot Vc/V_T) - 1\}]]\\
&= 1/[1 + \exp(b \cdot Vc/V_T) - 1]\\
&= 1/[\exp(b \cdot Vc/V_T)]\\
&= \exp(-b \cdot Vc/V_T)
\end{aligned}$$

From the Equation (3), it can be understood that the gain reduces exponentially if the first gain control signal Vc is increased from 0(V) in the positive direction. In the Equation (1), the denominator 1 in the right side impedes the gain control of the exponential function. According to the Equation (3), the gain varies exponentially because 1 doesn't exist in the denominator of the right side.

In a portable telephone, it is desirable to realize the circuit as much as possible by a CMOS process of low-cost more than the bipolar process. When the aforementioned variable gain amplifier is realized by using the CMOS process, the gain control characteristics shown by the Equation (3) cannot be obtained. This is because the input-output characteristics of the MOS type transistor is a square characteristic as shown by the Equation (5), while the input-output characteristics of the bipolar transistor is an exponential characteristic shown by the Equation (4):

$$Ic = Is \cdot \exp(V_{BE}/V_T) \qquad (4)$$

$$Id = \beta(V_{GS} - V_{TH})^2 \qquad (5)$$

where, Is is saturated current, $V_{BE}$ is base to emitter voltage, $V_T$ is thermal voltage, $\beta$ is a constant depending on the size of the MOS type transistor or process, $V_{GS}$ is gate to source voltage and $V_{TH}$ indicates threshold voltage.

BRIEF SUMMARY OF THE INVENTION

Therefore, it is an object of the present invention to provide a variable gain amplifier device configured of a MOS type transistor, capable of realizing exponential gain control with respect to a gain control signal.

According to a first aspect of the present invention, there is provided a variable gain amplifier device controlled by a first gain control signal, comprising: a gain controlled amplifier having a gain and including a differential pair of first and second MOS type transistors configured to operate in a weak inversion region; and a control signal converter configured to convert the first gain control signal into a second gain control signal, and supply the second gain control signal to the gain controlled amplifier to exponentially vary the gain with respect to the first gain control signal.

According to a second aspect of the present invention, there is provided a variable gain amplifier device controlled by a first gain control signal, comprising: a gain controlled amplifier having a gain and including a first differential pair of first and second MOS type transistors configured to operate in a weak inversion region, and a second differential pair of seventh and eighth MOS type transistors configured to operate in a weak inversion region; and a control signal converter configured to convert the first gain control signal into a second gain control signal, and supply the second gain control signal to the gain controlled amplifier to exponentially vary the gain with respect to the first gain control signal.

DETAILED DESCRIPTION OF THE INVENTION

First Embodiment

Figure 1:
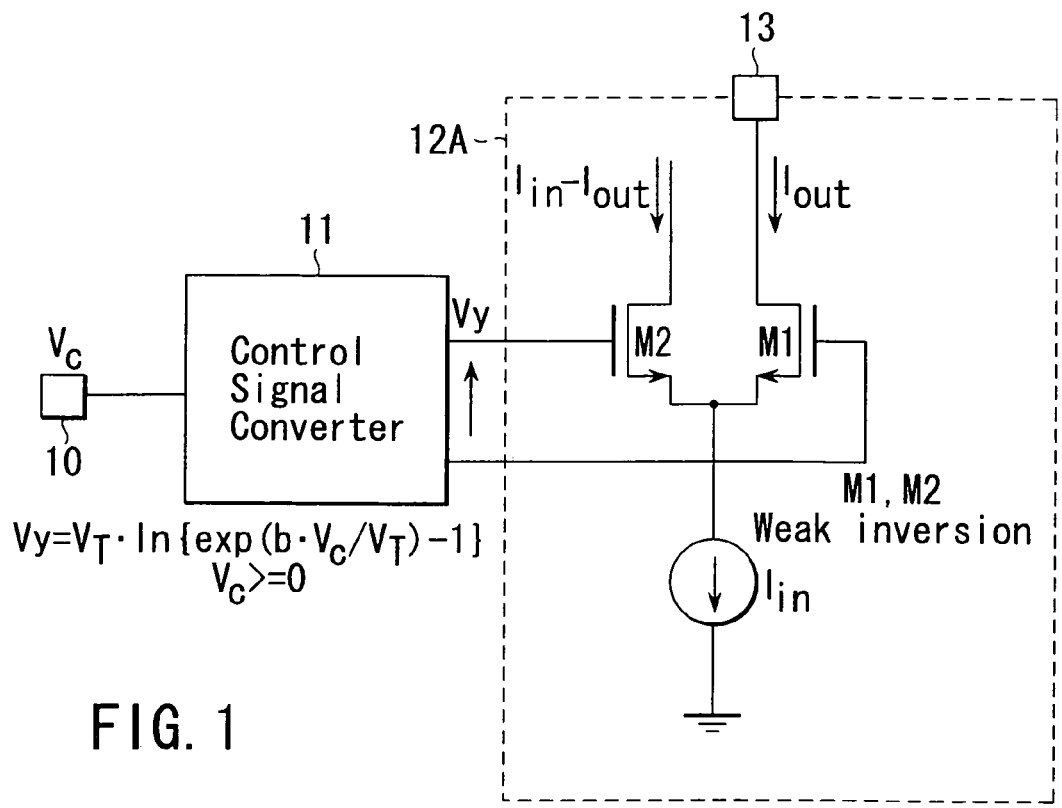
FIG. 1 is a block diagram showing a basic configuration of a variable gain amplifier device according to a first embodiment of the present invention.

FIG. 1 shows a basic constitution of a variable gain amplifier device according to a first embodiment of the present invention. The variable gain amplifier device of this embodiment is configured by using a MOS type transistor. A first gain control signal Vc for externally controlling a gain of the variable gain amplifier device is input to a gain control signal input terminal 10. The first gain control signal Vc is converted, by a control signal converter 11, into a second gain control signal Vy for controlling a gain of a gain controlled amplifier 12A exponentially with respect to Vc. The second gain control signal Vy is supplied to the gain controlled amplifier 12A.

In the gain controlled amplifier 12A, a differential pair of N type MOS type transistors MN1, MN2 are provided. An input signal current Iin to be amplified is injected into a common source terminal of the transistors MN1, MN2, and an amplified output signal current Iout is introduced from a drain terminal of the transistor MN1 to an output terminal 13. A current Iin-Iout flowing to a drain terminal of the transistor MN2 is a undesired current and, for example, flows to the power source. The gain control signal Vy made of a voltage signal is output from the control signal converter 11, and the gain control signal Vy is input between a gate terminal of the transistor MN1 and a gate terminal of the transistor MN2.

The transfer function shown by the Equation (1) of a conventional variable gain amplifier device using a bipolar transistor can be obtained when an input-output characteristics of the transistor is an exponential characteristic. As an input-output characteristics of a MOS type transistor is a square characteristic, the variable gain amplifier device using the MOS type transistor cannot in general realize such the transfer function.

However, when the current flowing in the MOS type transistor is reduced, in short, the density of the current flowing in the MOS type transistor is reduced, the input-output characteristics of the MOS type transistor vary from a generally known square characteristic to the exponential characteristic. A region of the low current density is called a weak inversion region. On the contrary, a region indicating a generally known square characteristic is called a strong inversion region. In other words, the strong inversion region is obtained when $V_{GS} \geq V_{TH}$ ($V_{GS}$: gate to source voltage, $V_{TH}$: threshold voltage), and the weak inversion region is obtained when $V_{TH}/2 < V_{GS} < V_{TH}$. The Equation (6) shows the input-output characteristics of the MOS type transistor:

$$I_D = I_{ON} \cdot \exp[(V_{GS} - V_{ON})/(n \cdot V_T)] \qquad (6)$$

where, $I_D$ is drain current, $I_{ON}$ is ON current, $V_{ON}$ is ON voltage, and $I_{ON}$, $V_{ON}$ and n are constants determined by the manufacturing processes of the MOS type transistor (for example, doping concentration of impurities, or the like). $V_T$ is thermal voltage, and $V_T = k \cdot T/q$ (k is Boltzmann's constant, T is absolute temperature, and q is electron charge) is established.

By using the Equation (6), the transfer function of the differential pair of transistors MN1, MN2 shown in FIG. 1 can be expressed by the Equation (7).

$$Iout/Iin = 1/[1 + \exp(Vy/nV_T)] \qquad (7)$$

In comparison of the Equation (7) and the Equation (1), the difference lies in that the constant n determined by the process is added, but it is a simple scaling of $V_T$, which does not particularly affect the acquisition of gain characteristics of the exponential function.

In the control signal converter 11, the exponential function gain control can be realized by using the gain control method used for the bipolar transistor, using the weak inversion region of the MOS type transistor similarly to the above case. The control signal converter 11 has basically the first gain control signal Vc as an input, and outputs the second gain control signal Vy having a voltage equal to the gate terminal potential difference of the transistors MN1, MN2 in the gain controlled amplifier 12A.

Figure 2:
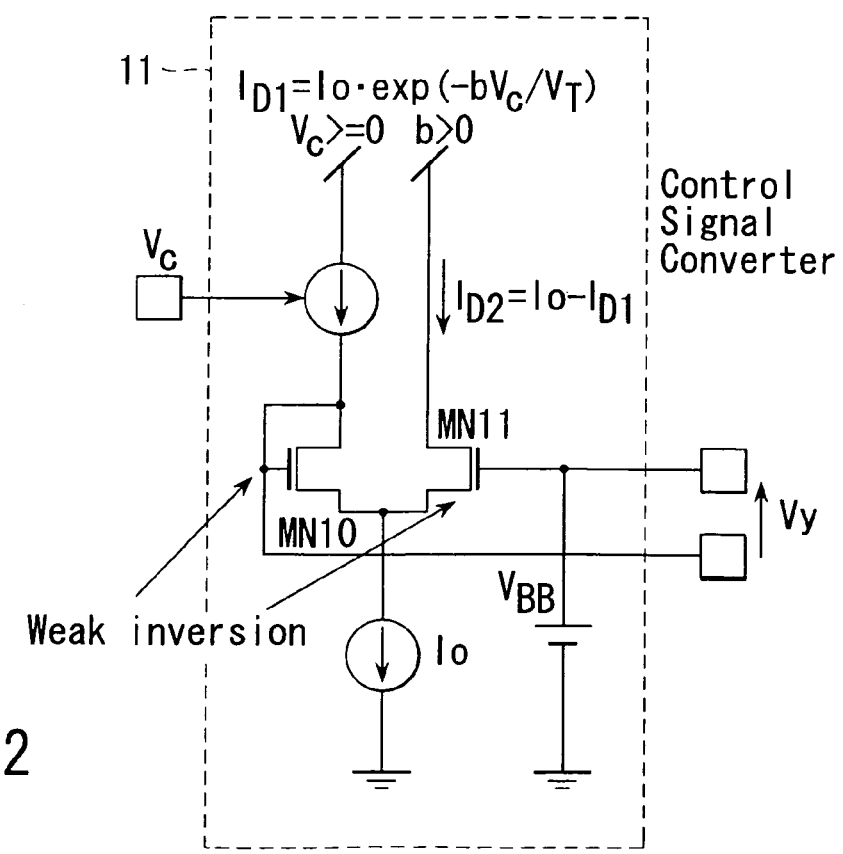
FIG. 2 is a circuit diagram showing a configuration of a control signal converter in FIG. 1.

FIG. 2 shows a concrete configuration of the control signal converter 11. The control signal converter 11 comprises a second differential pair of MOS type transistors MN10, MN11 operating in the weak inversion region. A direct current Io is input to a common source of the transistors MN10, MN11. A drain terminal and a gate terminal of the transistor MN10 are connected to each other. A current $I_{D1}=Io \cdot exp(-bvc/V_T)$ is input to the drain terminal of the transistor MN10. A constant direct voltage level is given to the gate terminal of the transistor MN11 from a power source $V_{BB}$. The drain terminal of the transistor MN11 is connected to, for example, a power source $V_{DD}$ (not shown). For the gain controlled amplifier 12A, it is required that the input impedance of the gain controlled amplifier 12A in regard to the control signal converter 11 is high. This requirement is met, as the input terminal of the gain controlled amplifier 12A is the gate terminal of the transistors MN1, MN2, as shown in FIG. 1.

Next, the fact that the relationship between the first gain control signal Vc which is the input to the control signal converter 11 and the second gain control signal Vy which is the output signal satisfies the Equation (2) will be described below.

The second gain control signal Vy output from the control signal converter 11 is equal to the potential difference between gate terminals of the transistor MN10 and the transistor MN11 of the gain controlled amplifier 12A. In short, $Vy=V_{GS}(MN11)-V_{GS}(MN10)$ is established. $V_{GS}$ (MN11) and $V_{GS}$ (MN10) are respectively the voltage between the gate terminal and source terminal of the transistors MN10, MN11. Consequently, the second gain control signal Vy can be expressed by the following Equation (8):

$$Vy = n \cdot V_T\{\ln((Io - I_{D1})/I_{ON}) - \ln(I_{D1}/I_{ON})\} \quad (8)$$
$$= n \cdot V_T \cdot \ln(Io/I_{D1} - 1)$$
$$= n \cdot V_T \cdot \ln(Io/(Io \cdot exp(-b \cdot Vc/V_T)) - 1)$$
$$= nV_T \cdot \ln\{exp(b \cdot Vc/V_T) - 1\}$$

This Equation (8) is obtained by multiplying the Equation (2) representing Vy in the case of a bipolar transistor by a constant n. Therefore, the relationship between the voltage of the first gain control signal Vc and the logarithm of the gain becomes linear by using the control signal converter 11. In short, by substituting Vy of the Equation (8) for the Equation (7), the Equation (7) becomes Iout/Iin=exp(-b·Vc/$V_T$) similar to the Equation (3) of a conventional variable gain amplifier device, thereby making it possible to vary exponentially the gain Iout/Iin with respect to the first gain control signal Vc.

Figure 3:
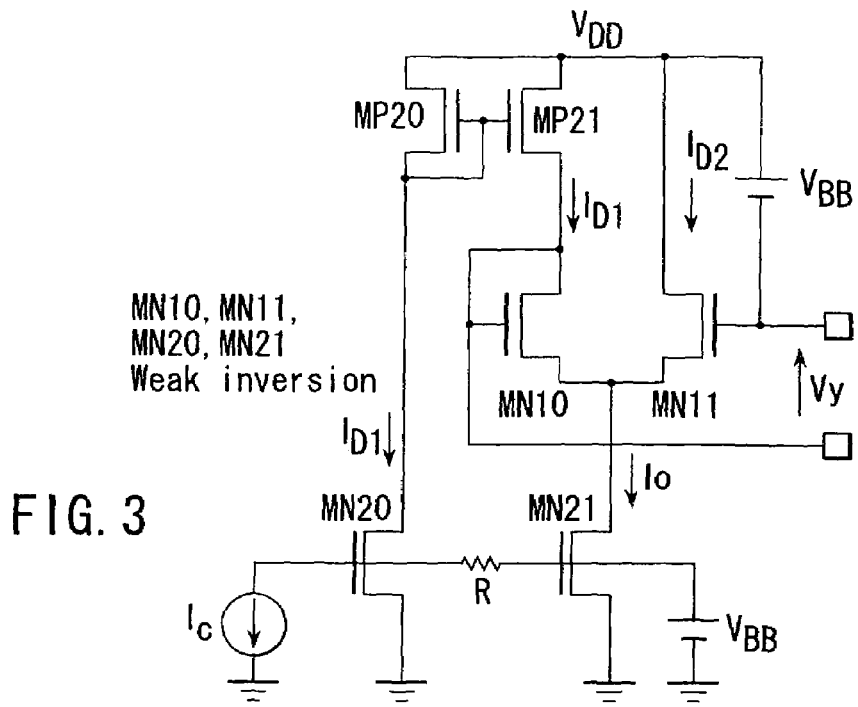
FIG. 3 is a circuit diagram showing in detail a part of the control signal converter shown in FIG. 2.

Next, a generation method of the current $I_{D1}$ to be applied to the control signal converter 11 will be described with reference to FIG. 3. In FIG. 3, it will be understood that N type MOS type transistors MN20, MN21 operate in the weak inversion region similarly to the transistors MN10, MN11. Only the differences from the FIG. 2 will be described below.

The current source Io in FIG. 2 is realized by a voltage source $V_{BB}$ and the transistor MN21 in FIG. 3. The gate terminal of the transistor MN21 is connected to the voltage source $V_{BB}$, and further to the gate terminal of the transistor MN20 and a gain control current source Ic (=k·Vc) through a resistor R. Ic represents a current proportional to the voltage of the second gain control signal Vc. The proportional coefficient is k. This current Ic can be realized simply by using a voltage-current conversion circuit such as differential circuit or the like connecting a source degeneration resistor between the source terminals.

The source of the transistor MN20 is grounded. The drain terminal of the transistor MN20 is connected to an input terminal (gate and drain terminals of MP20) of a current mirror circuit configured of P type MOS type transistors MP20, MP21. The drain terminal of the transistor MP21 which is the output terminal of the current mirror circuit is connected to the drain and gate terminals of the transistor MN10.

Now, it will be shown that the current $I_{D1}=Io \cdot exp(-b \cdot Vc/V_T)$ is generated by the circuit of FIG. 3.

The drain current Io of the transistor MN21 is expressed by the following Equation:

$$Io=I_{ON} \cdot exp[(V_{BB}-V_{ON})/n \cdot V_T] \quad (9)$$

As the gate voltage of MN20 becomes a voltage lower than $V_{BB}$ by the voltage drop of Ic·R, the drain current $I_{D1}$ of the transistor MN20 is expressed by the following Equation:

$$I_{D1} = I_{ON} \cdot exp[(V_{BB} - Ic \cdot R - V_{ON})/n \cdot V_T] \quad (10)$$
$$= I_{ON} \cdot exp[(V_{BB} - V_{ON})/n \cdot V_T] \, exp[(-Ic \cdot R/n \cdot V_T)]$$
$$= Io \cdot exp(-k \cdot Vc \, R/n \cdot V_T)$$
$$= Io \cdot exp(-b \cdot Vc/V_T)$$

where, k R/n=b. Consequently, it can be understood that the current $I_{D1}=Io \cdot exp(-b \cdot Vc/V_T)$ is generated by the circuit of FIG. 3.

By taking the manufacturing dispersion into consideration, the current Io may become lower with respect to the maximum value of the current $I_{D1}$. In this case, a Vc where an insensitive gain control range exists. In order to avoid this, W/L (ratio of gate width/gate length) of the transistor MN21 is made larger compared to the W/L of the transistor MN20. Therefore, it can be made to Io>$I_{D1}$ in the range of dispersion, and there will be no more Vc where the gain control becomes insensitive. Howsoever, the maximum gain lowers, as it results in $I_{D1}$<Io even in a case where Vc is 0. However, the maximum gain deterioration can be limited to 1 dB or less by a detailed designing, and is still practical enough.

On the other hand, in the case of performing the gain control from Vc=A (A>0), it can be achieved by taking an approach contrary to the above case. In short, W/L of the transistor MN20 is made larger than W/L of the transistor MN21 in order to obtain Io<$I_{D1}$. It is effective in the case where the gain control signal Vc cannot output 0V, and for example, can output only an output of 0.5V or more.

As mentioned above, according to this embodiment, the exponential gain control characteristics can be realized for the gain control signal by operating the MOS type transistor in the weak inversion region. Thus, the variable gain amplifier device capable of a wide range gain control can be provided at a low-cost more than the variable gain amplifier device using the conventional bipolar transistor.

Second Embodiment

Figure 4:
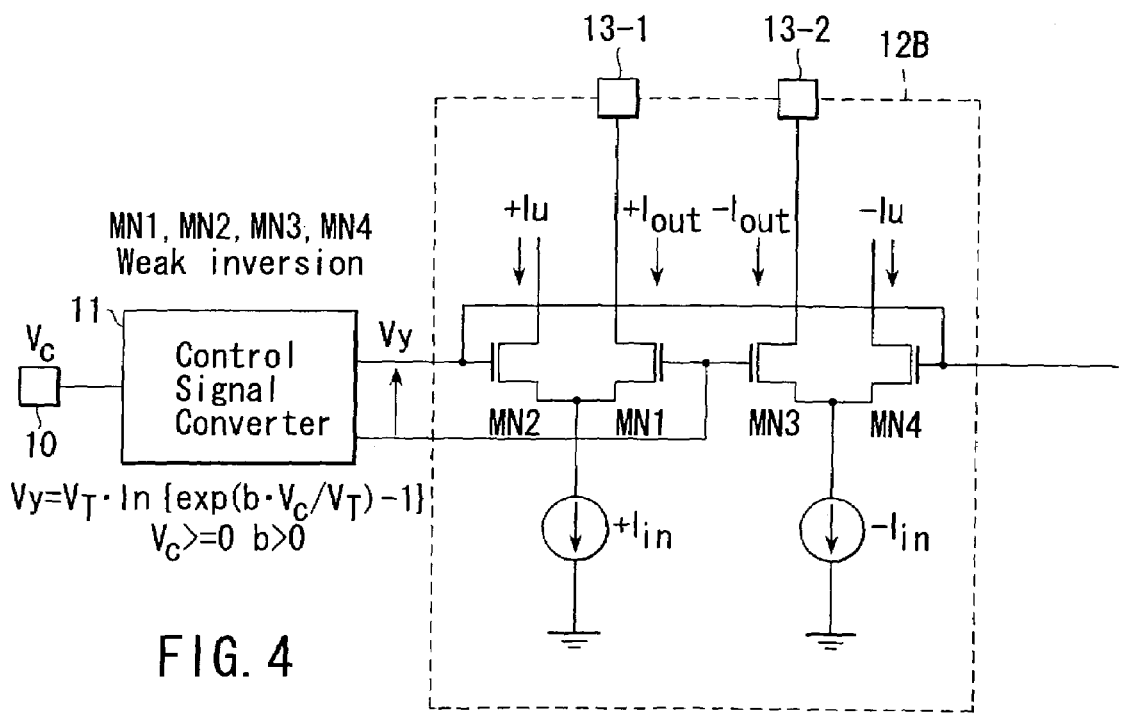
FIG. 4 is a block diagram showing a basic configuration of a variable gain amplifier device of differential configuration according to a second embodiment of the present invention.

FIG. 4 shows the basic configuration in a case where the gain controlled amplifier is made to the differential configuration, as a variable gain amplifier device according to a second embodiment of the present invention. The first gain control signal Vc is converted by the control signal converter 11 into the second gain control signal Vy, and the second gain control signal Vy is input to a gain controlled amplifier 12B.

The gain controlled amplifier 12B includes a first differential pair of N type MOS type transistors MN1, MN2, and a second differential pair of N type MOS type transistors MN3, MN4. All of transistors MN1 to MN4 are set to operate in the weak inversion region.

The second gain control signal Vy from the control signal converter 11 is input between a gate terminal of the transistor MN2 and a gate terminal of the transistor MN1, and between a gate terminal of the transistor MN4 and a gate terminal of the transistor MN3. A first input signal current +Iin is input to a common source terminal of the transistors MN1, MN2. A second input signal current −Iin in a complementary relation to +Iin is input to a common source terminal of the transistors MN3, MN4.

A first output signal current Iout is output from a drain terminal of the transistor MN1 to an output terminal 13-1. A second output signal current −Iout in a complementary relation to +Iout is output from a drain terminal of the transistor MN3 to a second output terminal 13-2. The output currents +Iu(=+Iin−(+Iout)) and −Iu(=−Iin−(−Iout)) from the transistors MN2, MN4, flow toward a power source.

As the relationship of Vy and Vc in the control signal converter 11 is similar to that in FIG. 1, the description thereof will be omitted here. The control signal converter 11 may be of the same configuration as the circuit shown in FIG. 3.

The variable gain amplifier device of the present invention is appropriate for a wireless communication apparatus such as portable wireless devices using the direct conversion system.

Figure 5:
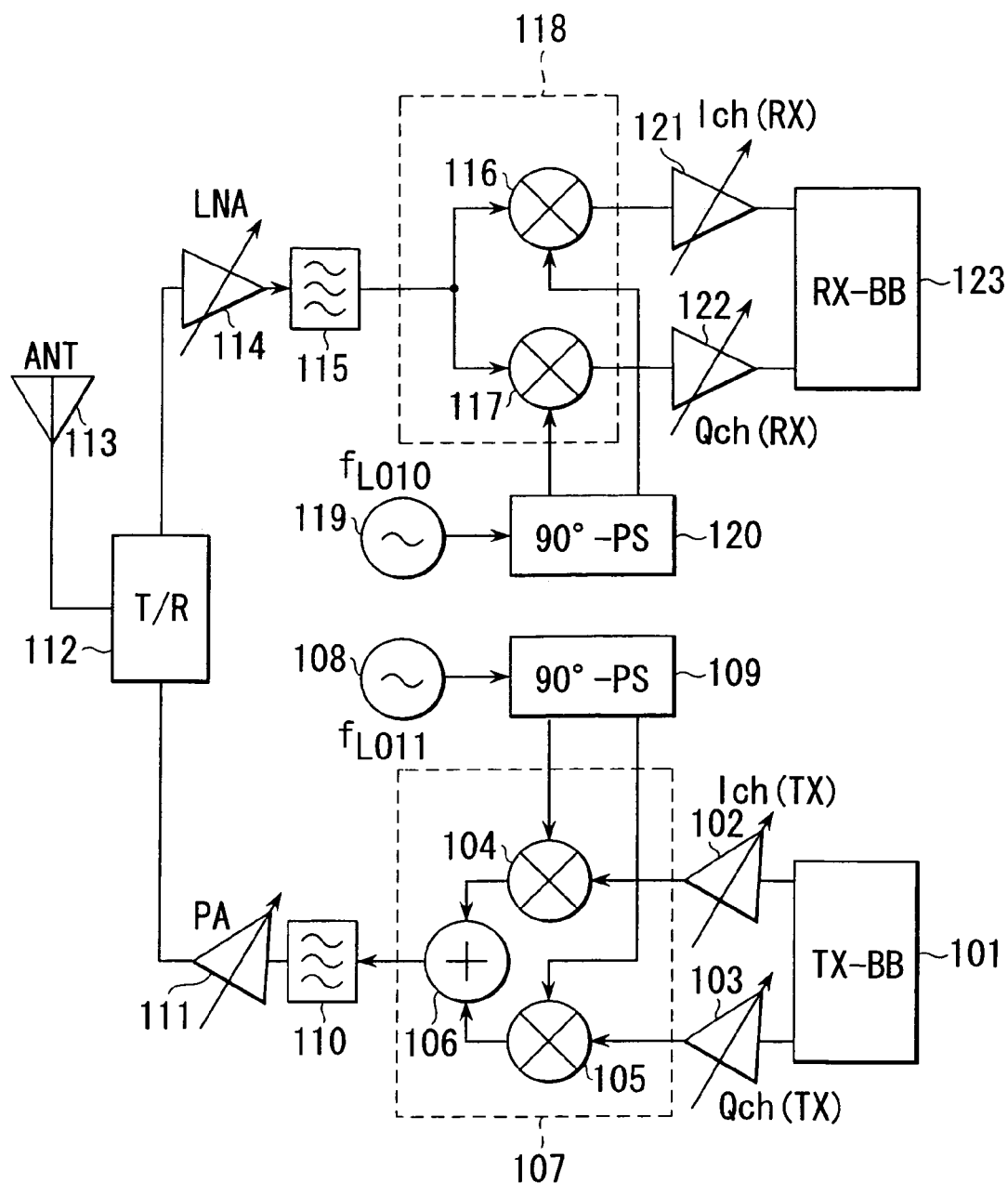
FIG. 5 is a block diagram showing a configuration of a transmission/reception section of a wireless communication apparatus of a direct conversion method for explaining a third embodiment of the present invention.

FIG. 5 shows the configuration of a transmission/reception circuit of a wireless communication apparatus using the direct conversion system. Here, the TDD (Time Division Duplex) for performing the changeover of transmission/reception by time division will be described as an example, however, the present invention is not limited thereto.

First, the transmission side will be described. First and second transmission baseband signals Ich(TX), Qch(TX) which are orthogonal to each other, and are band limited by an appropriate filter are output from a baseband signal generator (TX-BB) 101. The transmission baseband signals Ich(TX), Qch(TX) are amplified by baseband signal amplifiers 102, 103 each includes the variable gain amplifier device. The amplified transmission baseband signals Ich (TX), Qch(TX) are supplied to the baseband input of a quadrature modulator 107 configured of multipliers 104, 105 and an adder 106. To a local input of the quadrature modulator 107, quadrature local signals (suppose the frequency be $f_{LO11}$) generated by dividing a local signal generated by a local oscillator 108 into two by a 90° shifter (90°-PS) 109, in short, a first local signal and a second local signal different from the first local signal by π/2 phase are supplied. In the multiplier 104, the transmission baseband signal Ich(TX) is multiplied by the first local signal, to generate a first RF (radio-frequency) signal. In the multiplier 105, the transmission baseband signal Qch(TX) is multiplied by the second local signal to generate a second RF (radio-frequency) signal. The adder 106 combines the first and second RF signals to generate a transmission RF signal.

The transmission RF signal, after being removed of undesired components by a band pass filter 110, is input into a power amplifier (PA) 111. The power amplifier 111 has an RF stage variable gain amplifier device provided in the input stage thereof. The transmission RF signal input to the power amplifier 111 is adjusted to an appropriate signal level according to a control signal from a control system (not shown) by the RF stage variable gain amplifier device, and thereafter, amplified to a required power level. The amplified transmission RF signal is radiated from an antenna (ANT) 113 as a radio wave through a transmission/reception changeover switch (T/R) (or duplexer) 112.

Now, the reception side will be described. A reception RF signal from the antenna 113 is input to a low noise amplifier (LNA) 114 through the transmission/reception changeover switch 112 and amplified. The amplified reception RF signal is supplied to an RF input of a quadrature demodulator 118 configured of two multipliers 116, 117 through an image removal filter 115. To a local input of the quadrature demodulator 118, quadrature local signals (suppose the frequency be $f_{LO10}$) generated by dividing a local signal generated by a local oscillator 119 into two by a 90° shifter (90°-PS) 120, in short, a third local signal and a fourth local signal different from the third local signal by π/2 phase are supplied. In the multiplier 116, the reception RF signal is multiplied by the third local signal and the frequency conversion of the reception RF signal is performed to generate a first reception baseband signal Ich(RX). In the multiplier 117, the reception RF signal is multiplied by the fourth local signal and the frequency conversion of the reception RF signal is performed to generate a second reception baseband signal Ich(RX).

The reception baseband signals Ich(RX), Ich(RX) are amplified by baseband signal amplifiers 121, 122 each includes the variable gain amplifier device. The amplified reception baseband signal Ich(RX), Ich(RX) are input to a baseband signal processing section (RX-BB) 123 and the demodulation is performed here to reproduce the original data signal. The gain adjustment at the reception side is generally performed in the low noise amplifier 114 and the baseband signal amplifiers 121, 122.

In the CDMA system, the transmission is performed by carrying the transmission data from a plurality of users on a carrier. The reception side cannot perform a correct communication if there is a large dispersion in the transmission power of the data from a plurality of users. On the wireless terminal side, a wide transmission power control range of, for example, 70 dB or more according to the distance from the wireless terminal to the base station, is possible.

In the case of using a direct conversion wireless communication apparatus as shown in FIG. 5 in the CDMA system, it is necessary that the baseband signal amplifiers 121, 122 have a variable gain amplification function for controlling the transmission power. This is because the variable gain range in the RF stage variable gain amplifier device provided in the input stage of the power amplifier 111 is limited by the isolation between input and output.

In order to realize a wireless communication apparatus at a low cost, it is desirable to configure as much parts of the circuit as possible with a MOS type transistor. In the wireless communication apparatus shown in FIG. 5, it is desirable that power amplifier 111 and low noise amplifier 114, or the quadrature modulator 107 and the quadrature demodulator 118 and the like are made of bipolar transistors excellent in frequency characteristics, as they are required to operate up to a high frequency. On the contrary, the baseband signal amplifiers 102, 103 and 121, 122 may be made of MOS type transistor less excellent in frequency characteristics than the bipolar transistor, as they are inputted baseband signals. Consequently, the variable gain amplifier device realized by the MOS type transistor based on the embodiment of the present invention is especially appropriate for providing the baseband signal amplifiers 102, 103 and 121, 122 with the variable gain function.

Figure 6:
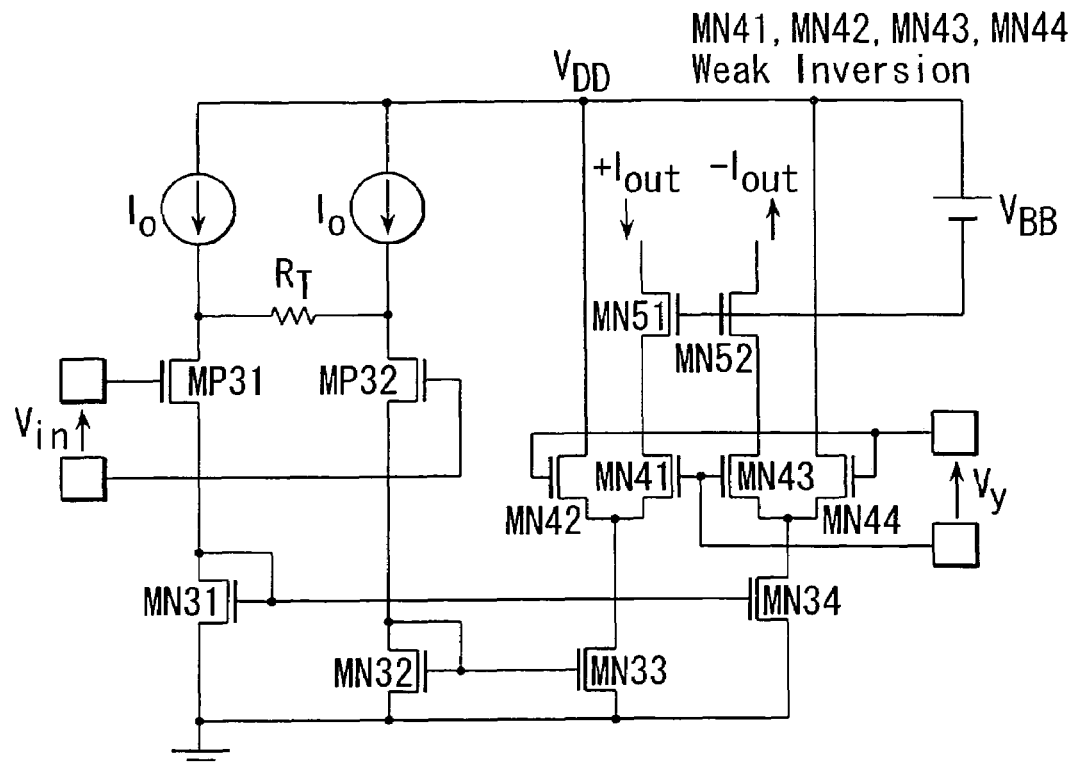
FIG. 6 is a circuit diagram showing a composition of the variable gain amplifier device applied to an amplifier of a transmission baseband signal according to the third embodiment of the present invention.

FIG. 6 shows a configuration of the baseband signal amplifier based on the embodiment of the present invention which is suitable to the baseband signal amplifiers 102, 103 provided in a front stage of the quadrature modulator 107 on the transmission side of FIG. 5. The baseband signal amplifier of FIG. 6 is configured on the basis of the variable gain amplifier device of differential configuration according to the second embodiment shown in FIG. 4.

A transmission baseband signal (Ich(TX) or Qch(TX)) output from the baseband signal generator 101 is supplied as an input signal Vin to the baseband signal amplifier shown in FIG. 6. The input signal Vin is converted into current from voltage by a differential amplifier including two P type MOS type transistors MP31, MP32. The respective source terminals of the transistors MP31, MP32 are connected to both ends of a source degeneration resistor $R_T$ and the current source Io.

The amplified baseband signal is output from the drain terminal of the transistors MP31, MP32 as a differential current signal. The differential current signal is folded by a current mirror circuit configured of N type MOS type transistors MN31, MN32, MN33 and MN34. The drain current of the transistor MN33 is input to a common source terminal of N type MOS type transistors MN41, MN42. The drain current of the transistor MN34 is input to a common source terminal of N type MOS type transistors MN43, MN44.

The transistors MN41, MN42, MN43, MN44 correspond to the transistors MN1, MN2, MN3, MN4 of the variable gain amplifier device 12B in FIG. 4, respectively. In short, the transistors MN41 and MN42 configure a first differential pair, while the transistors MN43 and MN44 configure a second differential pair. All the transistors MN41 to MN44 operate in the weak inversion region.

Though not shown in FIG. 6, a control signal converter similar to that described in the first and second embodiments is provided, and the second gain control signal Vy from this control signal converter 11 is input between a gate terminal of the transistor MN42 and a gate terminal of the transistor MN41, and between a gate terminal of the transistor MN44 and a gate terminal of the transistor MN43. Consequently, in the transistors MN41, MN42, MN43, MN44, an exponential gain control is performed for the transmission baseband signal according to the second gain control signal Vy.

Cascode transistors (common gate transistors) MN51, MN52 are arranged in the output stage of the baseband signal amplifier shown in FIG. 6. The transmission baseband signal that gain controlled by the transistors MN41, MN42, MN43, MN44 are outputted as current signals +Iout, −Iout through the common gate transistors MN51, MN52, and inputted into the quadrature modulator 107 shown in FIG. 5. There are two reasons for the usage of the cascode transistors MN51, MN52. The first reason is that, as the parasitic capacitor between the drain terminal and the substrate of the transistors MN41, MN42, MN43, MN44 is extremely large, when the baseband signal from the transistors MN41, MN42, MN43, MN44 is directly inputted into the quadrature modulator, it results in lowering the driving capability of a switching transistor in the quadrature modulator. The second reason is the prevention of generation of undesired signals such as carrier leak due to charge/discharge of the parasitic capacitor.

The parasitic capacitor is large because the W/L of the transistors MN41, MN42, MN43, MN44 becomes larger than the other transistors by 20 or more times, when the gain control transistors MN41, MN42, MN43, MN44 are operated in the weak inversion region for performing exponential gain control. In the case where such the parasitic capacitor is not a problem, the common gate transistors MN51, MN52 are not always necessary.

Figure 7:
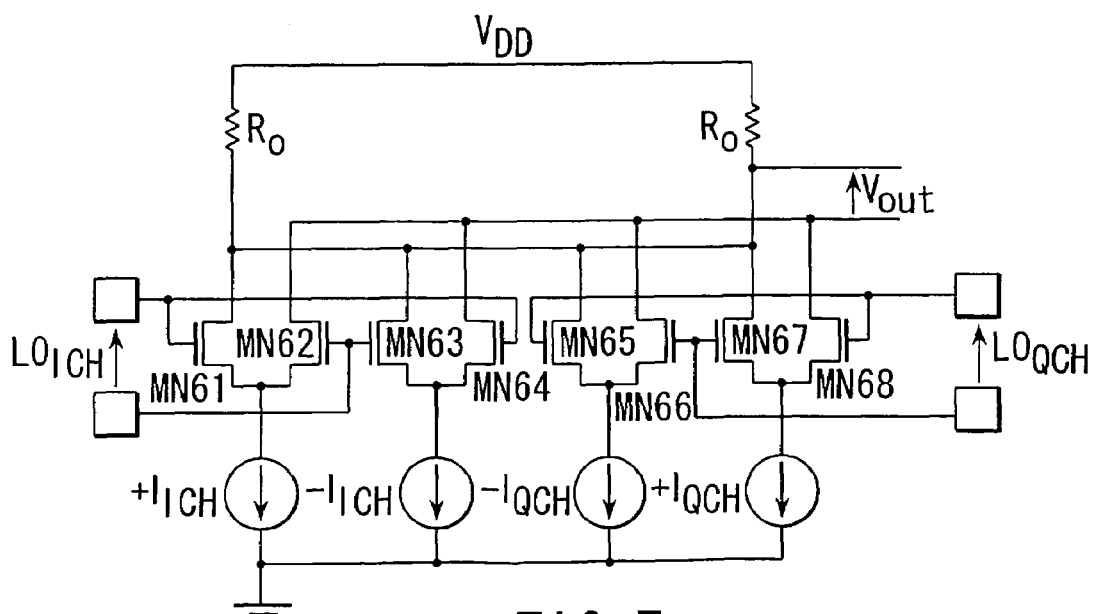
FIG. 7 is a circuit diagram showing a configuration of a quadrature modulator having an output signal of the variable gain amplifier device shown in FIG. 6 as an input signal.

FIG. 7 shows a concrete configuration example of the quadrature modulator 107. The circuit shown in FIG. 7 is known as double balanced modulator. Four sets of differential pairs are configured by N type MOS type transistors MN61 to MN68, and transmission baseband signals $+I_{ICH}$, $-I_{ICH}$, $+I_{QCH}$, $-I_{QCH}$ are input to a common source terminal of each differential pair. Output signal currents +Iout, −Iout from the baseband signal amplifier shown in FIG. 6 are input to the quadrature modulator 107 as $+I_{ICH}$, $-I_{ICH}$, or $+I_{QCH}$, $-I_{QCH}$. Drain terminals of four sets of differential pairs are connected in common four by four, and an output voltage signal Vout is obtained by two load resistors Ro.

Here, a case in which the variable gain amplifier device according to the embodiment of the present invention is applied to the baseband signal amplifier 102, 103 at the input side of the quadrature modulator 107 has been described as an example. Similarly, the variable gain amplifier device according to the embodiment of the present invention can also be applied to the baseband signal amplifiers 121, 122 of the rear stage of the quadrature demodulator 118.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wireless communication apparatus comprising:
   a baseband signal generator configured to generate first and second transmission baseband signals orthogonal to each other;
   first and second baseband signal amplifiers configured to amplify the first and second transmission baseband signals, respectively;
   a quadrature modulator configured to multiply the amplified first transmission baseband signal by a first local signal to produce a first radio frequency signal, multiply the amplified second transmission baseband signal by a second local signal having a π/2-phase which differs from the first local signal to produce a second radio frequency signal, and combine the first radio frequency signal and the second radio frequency signal into a transmission radio frequency signal; and
   a transmitter configured to transmit the transmission radio frequency signal,
   wherein the first and second baseband signal amplifiers each include (a) a gain controlled amplifier having a gain and including a first differential pair of first and second MOS type transistors configured to operate in a weak inversion region, and a second differential pair of third and fourth MOS type transistors configured to operate in a weak inversion region; wherein the first and second MOS type transistors include a common source terminal configured to receive a first input signal current corresponding to the first transmission baseband signal or the second transmission baseband signal and respective gates between which the second gain control signal is supplied, the third and fourth MOS type transistors include a common source terminal configured to receive a second input signal current in a complementary relation to the first input signal current and respective gates between which a second gain control signal is supplied, the gain controlled amplifier being configured to output a first output signal current from a drain terminal of the first MOS type transistor, and a second output signal current in a complementary relation to the first output signal current from a drain terminal of the third MOS type transistor, (b) a control signal converter configured to convert a first gain control signal into the second gain control signal, and supply the second gain control signal to the gain controlled amplifier to exponentially vary the gain with respect to the first gain control signal, and has a transmission characteristic defined by:

$$Vy = V_T \cdot \ln\{\exp(b \cdot Vc/V_T) - 1\}$$

where, Vc is the first gain control signal, Vy is the second gain control signal, $V_T$ is the thermal voltage, and b>0, the quadrature modulator is a double balanced modulator which includes a third differential pair of fifth and sixth transistors having a common source terminal configured to receive the first output signal current and a fourth differential pair of seventh and eighth transistors having a common source terminal configured to receive the second output signal current, the first and second baseband signal amplifiers include common gate transistors, respectively, and the common gate transistors are arranged to transmit the first output signal current and the second output signal current to the quadrature modulator.

* * * * *